(12) United States Patent
Nakajima

(10) Patent No.: US 6,759,792 B2
(45) Date of Patent: Jul. 6, 2004

(54) POLARIZATION METHOD OF A MULTI-LAYERED PIEZOELECTRIC BODY

(75) Inventor: Mikio Nakajima, Toyama-ken (JP)

(73) Assignee: Murata Manufacturing Co., LTD, Kyoto (JP)

(*) Notice: Subject to any disclaimer, the term of this patent is extended or adjusted under 35 U.S.C. 154(b) by 424 days.

(21) Appl. No.: 09/996,575

(22) Filed: Nov. 30, 2001

(65) Prior Publication Data

US 2003/0062912 A1 Apr. 3, 2003

(30) Foreign Application Priority Data

Feb. 1, 2001 (JP) ........................................ 2001-025160

(51) Int. Cl.$^7$ ............................................. H01L 41/24
(52) U.S. Cl. ...................... 310/359; 310/357; 29/25.35; 264/435; 264/436
(58) Field of Search ............................... 310/357, 359; 264/435, 436; 29/25.35

(56) References Cited

U.S. PATENT DOCUMENTS 4,625,137 A * 11/1986 Tomono ..................... 310/317
6,356,008 B1 * 3/2002 Nakajima ................... 310/359

FOREIGN PATENT DOCUMENTS

| JP | 60-66882 | * 4/1985 | .................. 310/311 |
| JP | 10-4330 | 1/1998 | ............. H03H/9/17 |
| JP | 2001-111132 | * 4/2001 | ........... H01L/41/22 |
| JP | 2003-282993 | * 10/2003 | .......... H01L/41/083 |

* cited by examiner

Primary Examiner—Thomas M. Dougherty
(74) Attorney, Agent, or Firm—Keating & Bennett, LLP (57) ABSTRACT

In a polarization method of the multi-layered piezoelectric body in which a plurality of piezoelectric layers and a plurality of internal electrodes are alternately laminated and adjacent piezoelectric layers are polarized in the thickness direction such that the polarized directions thereof are in opposite directions, a first polarization process in which an electric field in one direction is applied in the thickness direction to the multi-layered piezoelectric body and a polarization is uniformly performed in the thickness direction, and a secondary polarization process in which an electric field in the opposite direction is applied to the piezoelectric layers on both sides of one of the internal electrodes and the direction of polarization of only one of the piezoelectric layers on one side of the internal electrode is reversed are provided. The secondary polarization is performed in the range such that the remaining polarization degree Pr2 that exists after the secondary polarization in the piezoelectric layer 1b in which the direction of polarization is reversed does not exceed the remaining polarization degree of Pr1 that exists after the first polarization.

19 Claims, 10 Drawing Sheets first polarization second polarization

FIG. 3
PRIOR ART polarization degree ↑

FIG. 4 initial polarization $\Delta P_1$ $P_{max}$ reverse polarization $P_{max}$

$\Delta P_2$

FIG. 5 first polarization    second polarization

equivalent

FIG. 7 first polarization      second polarization

POLARIZATION METHOD OF A MULTI-LAYERED PIEZOELECTRIC BODY

BACKGROUND OF THE INVENTION

1. Field of the Invention

The present invention relates to a polarization method of a multi-layered piezoelectric body used for a filter of a portable telephone, or other suitable electronic component, and more particularly, the present invention relates to a polarization method of a multi-layered piezoelectric body in which a plurality of piezoelectric layers and a plurality of internal electrodes are alternately laminated and adjacent piezoelectric layers are polarized in the thickness direction such that the polarization directions thereof are opposite to each other.

2. Description of the Related Art

Conventionally, a length mode piezoelectric resonator has large design freedom, small spurious vibrations, and the difference df between a resonance frequency and an anti-resonance frequency is large. See, for example, Unexamined Japanese Patent Publication No. 10-4330 gazette.

Figure 1:
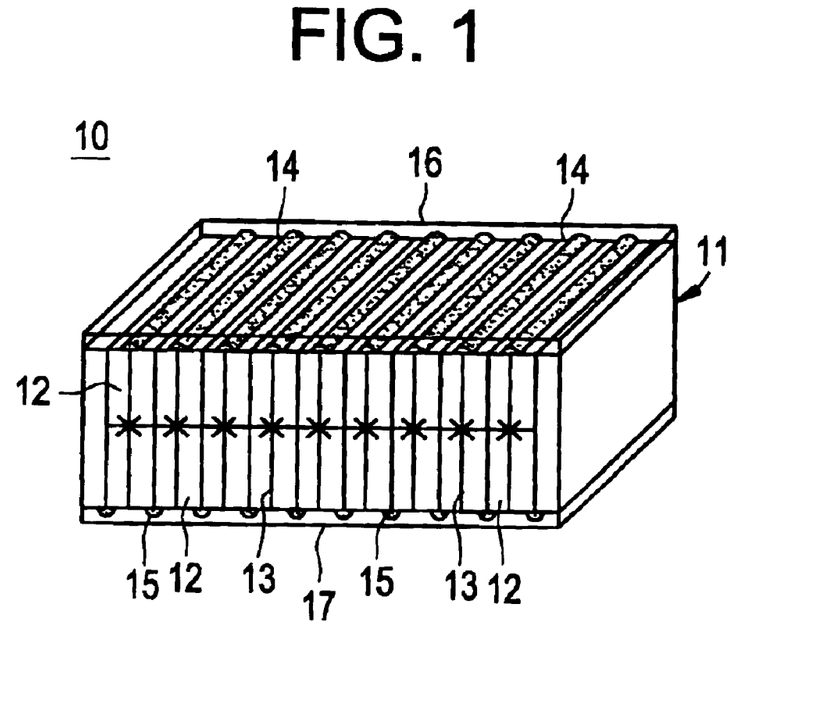
FIG. 1 is a perspective diagram of an example of a piezoelectric resonator according to a preferred embodiment of the present invention.

FIG. 1 shows an example of this length mode piezoelectric resonator 10. The piezoelectric resonator 10 includes a base 11 in which a plurality of piezoelectric layers 12 and a plurality of internal electrodes 13 are laminated alternately. The piezoelectric layers on both sides of the internal electrodes 13 are polarized in opposite directions. Insulating films 14 and 15 are alternately provided to cover ends of the internal electrodes 13. Furthermore, external electrodes 16 and 17 are provided on opposing surfaces of the piezoelectric resonator 10. Therefore, the external electrodes 16 and 17 are alternately connected to every other one of the internal electrodes 13.

In the piezoelectric resonator 10, the polarization degree of the piezoelectric layer 12 greatly influences the properties thereof. Therefore, variations in the polarization degree within each element and variations in the polarization degree variation between elements must be minimized.

In this type of piezoelectric resonator, a block-like multi-layered piezoelectric body is provided. After polarization is performed, the piezoelectric body is cut into separate piezoelectric resonators. The polarization process of the multi-layered piezoelectric body is performed by the method shown in FIG. 2. A multi-layered piezoelectric body 1 is defined by a block-like piezoelectric ceramic material member. Here, although four piezoelectric layers 1a to 1d are shown to simplify the explanation, many layers are laminated together to produce the piezoelectric resonator. Between the piezoelectric layers 1a to 1d, internal electrodes 2a to 2c are provided. The internal electrodes 2a to 2c are alternately led out to a side surface of the piezoelectric body 1, and are connected with side surface electrodes 3 and 4. Also, by applying the DC electric field between the side surface electrodes 3 and 4, as illustrated by arrow P, the piezoelectric layers 1b and 1c on both sides of the internal electrode 2b are polarized in opposite directions thereby obtaining a desired polarization degree.

Figure 2:
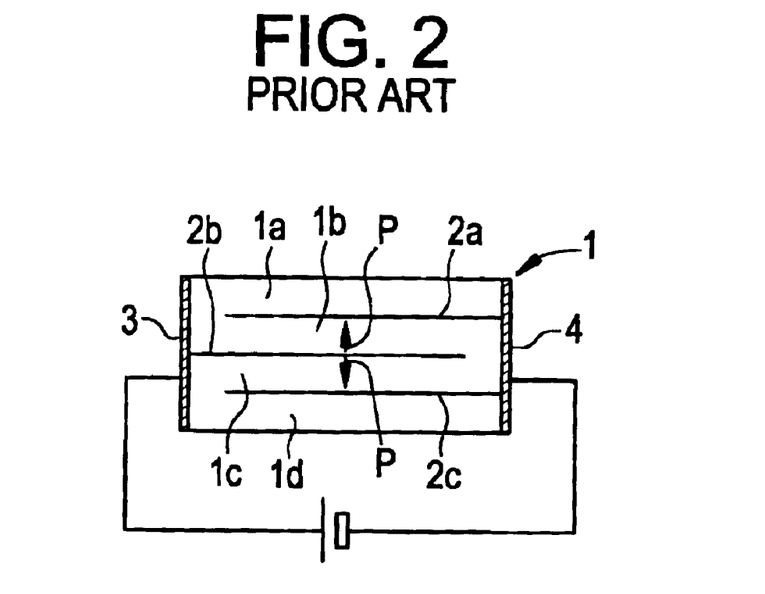
FIG. 2 is a diagram showing a polarization method of the conventional multi-layered piezoelectric body.
Figure 3:
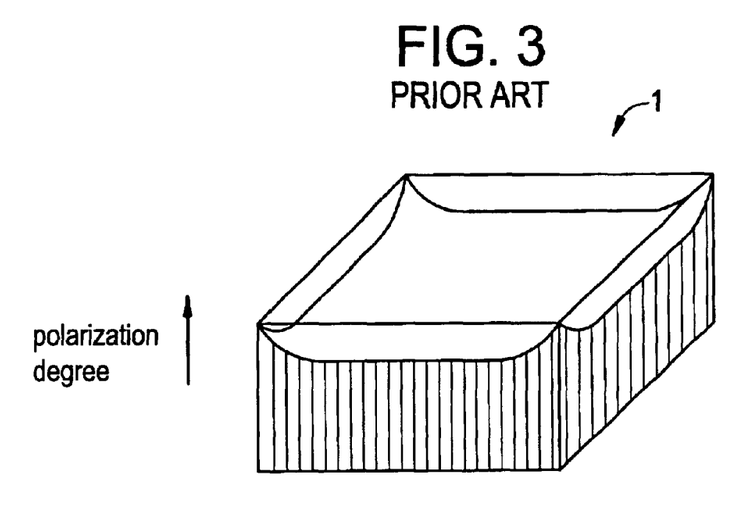
FIG. 3 is a perspective diagram showing a polarization degree distribution of a block-like piezoelectric body in which a polarization was performed by the method of FIG. 2.

However, in the method as shown in FIG. 2, because an electric field concentrates on the edge portion of the internal electrodes 2a to 2c, the polarization degree distribution is not uniform. FIG. 3 shows an example of the polarization degree distribution in one piezoelectric layer. An oblique line illustrates the polarization degree. As shown in the FIG. 3, if the electric field is applied in the thickness direction to the piezoelectric body 1, the polarization degree at the four corner sections of the piezoelectric body 1 is substantially increased (concave distribution), and a uniform polarization degree distribution is not obtained. As a result, when lamination elements used to form the block having piezoelectric layers with non-uniform polarization degree distributions are laminated, and the lamination is cut into a rectangular shape to define an element, it is impossible to use the peripheral sections of the piezoelectric body, and thus the yield of the piezoelectric body is greatly reduced.

For example, when performing the polarization of a multi-layered piezoelectric body for series resonators (fr= 450 kHz, df=55 kHz) used for a ladder-type filter by the method shown in FIG. 2, the variation in the polarization degree df in the block is at least 10 kHz. Therefore, only elements cut from near the center of the block can be used, and the polarization of the peripheral element of the block is defective and cannot be used.

Figure 4:
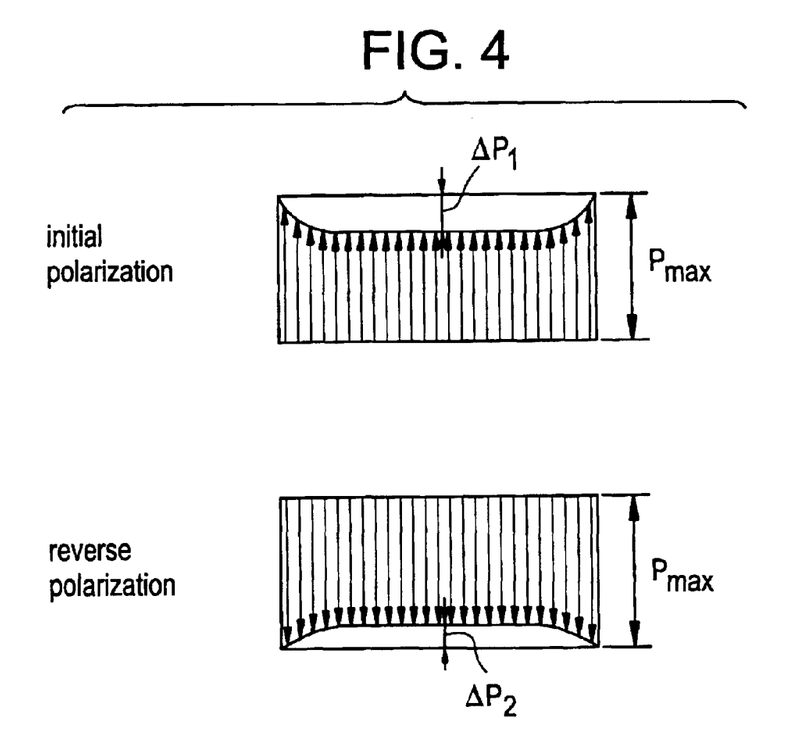
FIG. 4 is a diagram showing the polarization degree distribution at a time of the initial polarization and the reversed polarization.

Consequently, the inventions of the present application have suggested a method in which an electric field is applied to opposing external electrodes of a main surface of a multi-layered piezoelectric body, after performing the polarization (initial polarization) in one thickness direction of the multi-layered piezoelectric body, a side surface electrode which leads an internal electrode out is alternately provided. An electric field is applied between the side electrodes and only the direction of polarization of the piezoelectric layer of one side of the internal electrode is reversed (polarization reversal), and a desired polarization degree is obtained. See, for example, Japanese Unexamined Patent Application No. 2000-52743. In this method, as shown in FIG. 4, even when there is a variation in polarization degree $\Delta P1$ between a peripheral section and a center section in the initial polarization, when the electric field is applied in the opposite direction and the direction of polarization is reversed, polarization degree variations are reduced to $\Delta P2$. Thus, the non-uniformity of the polarization degree distribution after an initial polarization is corrected.

However, when the polarization of a saturated polarization degree Pmax of the piezoelectric layer having a direction of polarization that is reversed is performed until it becomes almost equal to saturated polarization degree Pmax at the time of an initial polarization, although the polarization degree variation is reduced, a polarization degree distribution of the piezoelectric layer in which polarization reversal is performed becomes concave in a similar manner as before the polarization reversal. Therefore, when a multi-layered piezoelectric body is constructed in which the piezoelectric layers are polarized in a reverse direction are laminated alternately by the above-mentioned method, the piezoelectric layer with a concave distribution in which the polarization reversal is performed and the piezoelectric layer with a concave distribution in which the polarization reversal is not performed are laminated alternately. Also, in a multi-layered piezoelectric body as a whole, a uniform polarization degree distribution is not reliably obtained.

SUMMARY OF THE INVENTION

To overcome the above-described problems, preferred embodiments of the present invention provide a polarization method for a multi-layered piezoelectric body that produces a polarization degree distribution of the entire multi-layered piezoelectric body that is uniform, thus greatly improving the yield.

According to a preferred embodiment of the present invention, a polarization method for a multi-layered piezoelectric body includes alternately laminating a plurality of piezoelectric layers and a plurality of internal electrodes and polarization of the adjacent piezoelectric layers is performed in the thickness direction thereof so as to polarize the adjacent piezoelectric layers in opposite directions, a first polarization process in which an electric field in one thickness direction is applied to the multi-layered piezoelectric body and uniformly performs the polarization in the thickness direction, and a secondary polarization process in which the electric field is applied in the opposite thickness direction to the piezoelectric layers on both sides of the internal electrodes and only the direction of polarization of the piezoelectric layer of one side of the internal electrode is reversed. The above secondary polarization is performed in a range such that a remaining polarization degree Pr2 that exists after the secondary polarization in the piezoelectric layer having a direction of polarization that is reversed does not exceed a remaining polarization degree Pr1 that exists after the first polarization.

Further, according to a preferred embodiment of the present invention, in a polarization method of the multi-layered piezoelectric body in which a plurality of piezoelectric layers and a plurality of internal electrodes are laminated alternately and the polarization of the adjacent piezoelectric layers is performed in opposite thickness directions, a first polarization process is performed in which electric fields of opposite directions are applied to the piezoelectric layers on both sides of the internal electrode and the polarization is performed on the piezoelectric layers on both sides of the internal electrode in opposite directions, and a secondary polarization process is provided in which an electric field in the opposite direction of the electric field in the first polarization process is applied in opposite directions and the direction of polarization of the piezoelectric layers of both sides of the internal electrode is reversed, wherein the above secondary polarization is performed in a range such that the remaining polarization degree Pr2 that exists after the secondary polarization in the piezoelectric layer having a direction of polarization that is reversed does not exceed the remaining polarization degree of Pr1 that exists after the first polarization.

A first polarization is performed by applying an electric field in one thickness direction to a multi-layered piezoelectric body, to uniformly polarize the multi-layered piezoelectric body in the thickness direction. Next, a secondary polarization is performed by applying an electric field in an opposite direction relative to the piezoelectric layers on both sides of the internal electrode and only the direction of polarization of the piezoelectric layer of one side of the internal electrode is reversed.

Other features, elements, characteristics and advantages of the present invention will become more apparent from the following detailed description of the preferred embodiments with reference to the attached drawings.

DETAILED DESCRIPTION OF PREFERRED EMBODIMENTS

Figure 5:
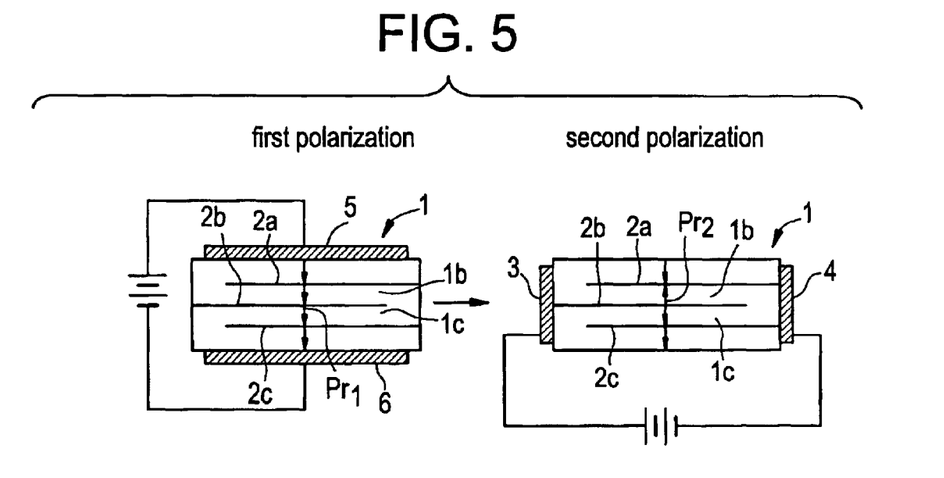
FIG. 5 is a process drawing showing an example of a polarization method in accordance with a preferred embodiment of the present invention.

FIG. 5 shows an example of a polarization method according to a preferred embodiment of the present invention. First, front and back electrodes 5 and 6 are provided on front and back surfaces of the multi-layered piezoelectric body 1, the DC electric field in the thickness direction is applied to the multi-layered piezoelectric body 1, and the polarization (first polarization) is performed in one thickness direction. Then, the internal electrodes 2a to 2c are alternately led out to the outside surface of the multi-layered piezoelectric body 1 and connected to side surface electrodes 3 and 4. By applying the DC electric field between the side surface electrodes 3 and 4, electric fields of opposite directions are applied to the piezoelectric layers 1b and 1c on both sides of the internal electrode 2b and only the direction of polarization of the piezoelectric layer 1b of one side of the internal electrode 2b is reversed (secondary polarization). In addition, repolarization of only the piezoelectric layer 1c on the other side of the internal electrode 2b is performed. Thus, the direction of polarization is not reversed.

The polarization conditions at the time of the secondary polarization were changed, and the inventor discovered that a polarization degree distribution of the piezoelectric layer 1b having the reversed polarization axis varies with the degree (the remanent polarization degree) of progress of the secondary polarization.

FIGS. 6(a) to 6(d) show the changes in the degree of distribution of polarization in the two piezoelectric layers 1b and 1c as the secondary polarization is performed. An arrow shows the direction of the polarization.

Figure 6A:
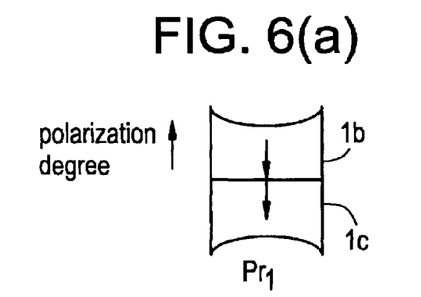
FIGS. 6(a) to 6(d) are diagrams showing variations in the polarization degree distribution of two adjacent piezoelectric layers when performing the polarization method shown in FIG. 5.
Figure 6B:
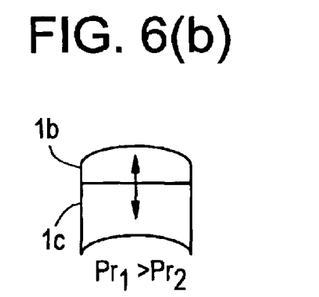
Figure 6C:
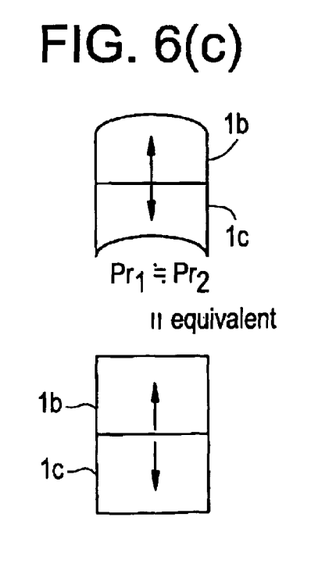
Figure 6D:
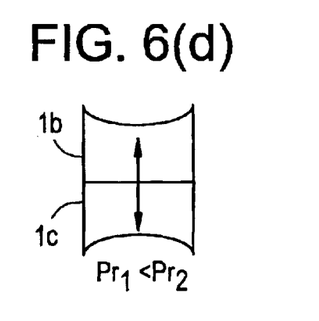

FIG. 6(a) shows the polarization degree distribution after the first polarization. The polarization degree distribution includes concave distributions. FIGS. 6(b) to 6(d) show a variation of the polarization degree distribution as the secondary polarization is performed. In addition, Pr1 shows a remaining polarization degree caused by the first polarization. Pr2 shows a remaining polarization degree caused by the secondary polarization.

As clearly shown in FIG. 6, the polarization degree distribution of the piezoelectric layer 1b is a convex-shaped or flat distribution such as (b) and (c) when the direction of polarization is initially reversed. However, as shown in (d), the polarization degree distribution changes to a concave shape as the secondary polarization progresses. In addition, the polarization degree distribution of piezoelectric layer 1b in (b) and (c) is convex-shaped in the example shown in FIG. 6. However, some materials have an approximately flat distribution. Thus, if the secondary polarization progresses too much, the polarization degree distribution of the piezoelectric layer 1b becomes a similar concave distribution as produced by the first polarization (however, the direction of a polarization is reversed). In addition, the polarization degree distribution of the piezoelectric layer 1c by remains concave.

Therefore, as shown in (d), when the reversed polarization progresses too much, the polarization degree distribution of the piezoelectric layer 1b in which the reversal polarization is performed and a polarization degree distribution of the piezoelectric layer 1c in which reversed polarization is not performed are both concave. Thus, a uniform polarization degree distribution in the overall piezoelectric body is not produced.

Consequently, the secondary polarization is terminated in a range such that the polarization degree distribution of the piezoelectric layer 1b having a direction of polarization that is reversed is either convex-shaped or flat. In other words, the secondary polarization is performed in a range wherein the remaining polarization degree Pr2 that exists after the secondary polarization does not exceed the remaining polarization degree Pr1 that exists after the first polarization, such that $Pr1 \geq Pr2$.

When the above equation is satisfied, since the polarization degree distribution of the piezoelectric layer 1b in which the direction of polarization is reversed is convex or flat and the polarization degree distribution of piezoelectric layer 1c in which the direction of polarization is not reversed is concave, the convex-shaped polarization degree distribution and the concave polarization degree distribution offset each other. Further, the degree of unevenness of the concave distribution is greatly reduced. Thus, the multi-layered piezoelectric body achieves a substantially uniform polarization degree distribution. As a result, the usable portion of the piezoelectric body greatly increases, and therefore the yield greatly improves.

In addition, where Pr1>Pr2, the amplitude of the polarization degree of the two layers 1b and 1c is unbalanced. However, when the polarization degree distribution is substantially uniform, the resonance characteristic of a length vibration mode element is not adversely affected.

Where Pr2≈Pr1, as shown in (c) of FIG. 6, the size of the polarization degree of the two layers 1b and 1c is approximately equal, and the distribution of the multilayer piezoelectric body is uniform, resulting in greatly improved properties.

According to a second preferred embodiment of the present invention, a first polarization process includes a first process to apply an electric field in a first thickness direction to a multi-layered piezoelectric body, and a second process to apply the electric field in the thickness direction that is opposite to the first thickness direction to the multi-layered piezoelectric body. The direction of polarization of the multi-layered piezoelectric body produced by the first process is uniformly reversed by the second process.

Thus, the first polarization is performed only once. However, the polarization degree distribution is concave after the initial polarization of FIG. 4. Also, the difference ΔP1 between a center section and an edge portion is large. Consequently, multiple operations of the first polarization are performed. If a direction of polarization is reversed over the entire multi-layered piezoelectric body, the difference ΔP2 between a center section and an edge portion decreases when polarization reversal occurs of FIG. 4. Also, the non-uniformity of the degree distribution of polarization is corrected. Thus, the non-uniformity of the polarization degree distribution of the piezoelectric layer after the secondary polarization is corrected by correcting the non-uniformity of the degree distribution of polarization in the first polarization.

In addition, the second process may be performed multiple times.

According to a third preferred embodiment of the present invention, a first polarization that applies an electric field in opposite directions to the piezoelectric layers on both sides of the internal electrode to produce polarization of the piezoelectric layers on both sides of the internal electrode in opposite directions is performed. A secondary polarization in which electric fields in the opposite directions to the above-mentioned electric fields are applied to the piezoelectric layers on both sides of the internal electrode and the polarization axes of the piezoelectric layers on both sides of the internal electrode are reversed. In other words, the secondary polarization axial direction of the piezoelectric layers on both sides of the internal electrode is reversed relative to the first polarization axial direction.

Figure 7:
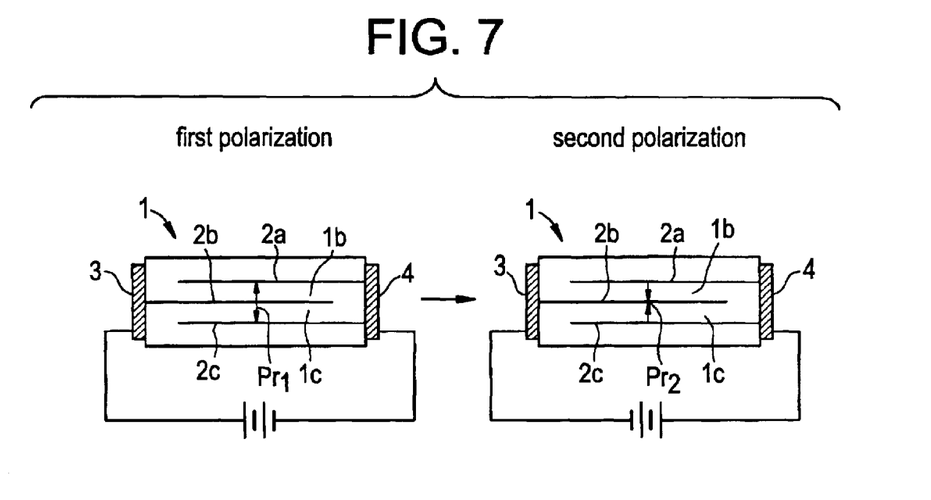
FIG. 7 is a process drawing showing an example of a polarization method according to a preferred embodiment of the present invention.

FIG. 7 shows an example of the polarization method described above. First, the internal electrodes 2a to 2c are alternately led out to the outside surface of the multi-layered piezoelectric body 1. Side electrodes 3 and 4 are electrically connected to the internal electrodes 2a to 2c. In addition, the polarization is performed on the piezoelectric layers 1b and 1c on both sides of the internal electrode 2b in opposite directions by applying a DC electric field between the side surface electrodes 3 and 4 (first polarization). This polarization process is the same as the polarization process in the prior art (FIG. 2). Next, a DC electric field in a reversed direction is applied between the side surface electrodes 3 and 4, and the polarization axes of the piezoelectric layers 1b and 1c on both sides of the internal electrode 2b are reversed simultaneously (secondary polarization).

Also in this case, the secondary polarization is performed in a range such that the remaining polarization degree Pr2 existing after the secondary polarization in the piezoelectric layers 1b and 1c having polarization axes that are reversed does not exceed remaining polarization degree Pr1 existing after the first polarization.

In this case, because the polarization axes of the piezoelectric layers 1b and 1c on both sides of the internal electrode 2b are reversed and a repolarization layer is not present, the polarization conditions of the two layers 1b and 1c are approximately equal. While attaining equalization of a polarization degree distribution, the amplitude of the polarization degree of the two layers 1b and 1c is also approximately equal.

FIG. 8 shows a change of the polarization degree distribution in the piezoelectric layers 1b and 1c when performing the secondary polarization by the method shown in FIG. 7. An arrow shows the direction of the polarization.

Figure 8A:
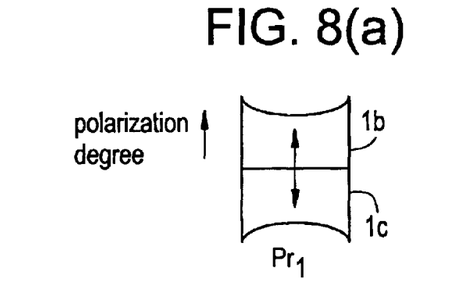
FIGS. 8(a) to 8(d) are diagrams showing variations in a polarization degree distribution of adjacent two piezoelectric layers when performing the polarization method shown in FIG. 7.
Figure 8B:
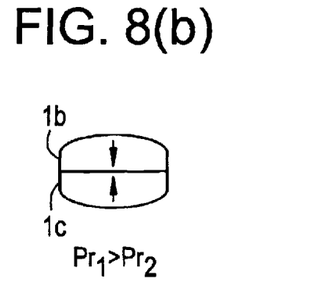
Figure 8C:
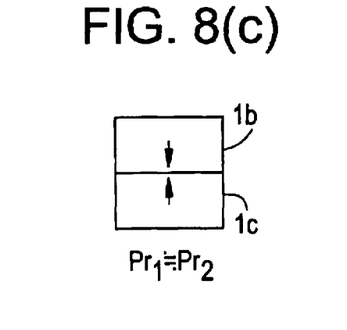
Figure 8D:
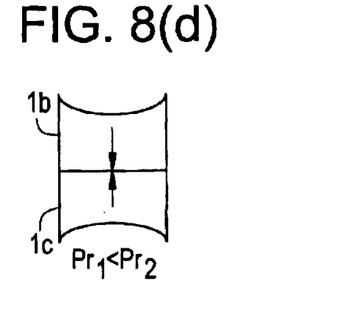

FIG. 8(a) shows the polarization degree distribution after the first polarization. The polarization degree distribution is concave. FIGS. 8(b) to 8(d) show a variation of the polarization degree distribution when the secondary polarization is performed. After the direction of polarization is reversed by the secondary polarization, the degree of polarization of the two layers 1b and 1c is approximately equal, and the polarization degree distribution becomes flat or convex shaped. The degree of unevenness of the degree distribution of polarization of both the layers 1b and 1c is greatly reduced. If the secondary polarization is performed until the remaining polarization degree Pr2 is approximately equal to the remaining polarization degree Pr1 caused by the first polarization, as shown in (c), the two layers 1b and 1c have a flat or convex-shaped distribution, the polarization degree increases, and polarization degree distribution is optimized. If the secondary polarization progresses further, the distribution becomes concave as shown in (d).

Therefore, a multilayer piezoelectric body 1 having a uniform polarization degree distribution is obtained by setting the secondary polarization conditions such that Pr1≧Pr2.

It is desirable to perform the first polarization process on a block-like multi-layered piezoelectric body, and to perform the secondary polarization process to the multi-layered piezoelectric body having a substantially rectangular shape.

That is, to enhance productivity, it is preferable to perform both the first polarization and the secondary polarization on a block-like multi-layered piezoelectric body. However, the non-uniformity of the polarization degree distribution at the time of the first polarization is three-dimensional, as shown in FIG. 3. Therefore, if the secondary polarization is performed on the block-like multi-layered piezoelectric body, the non-uniformity of the polarization degree distribution cannot be eliminated.

Consequently, if the secondary polarization is performed after cutting the block-like piezoelectric body into a substantially rectangular shape, the electric field strength and the duration can be set depending upon the polarization degree distribution of each substantially rectangular body. Therefore, variations in the degree of polarization between different substantially rectangular bodies and in the substantially rectangular body is greatly reduced.

In the multi-layered piezoelectric body in which the first polarization is performed, a length vibration is not excited because the polarization is uniformly performed in the thickness direction.

Consequently, a difference DF between the resonance frequency and an antiresonance frequency of an area expansion mode is calculated, and the degree of polarization is determined. On the other hand, in the multi-layered piezoelectric body in which the secondary polarization is performed, the length mode vibration is excited because the body includes layers in which the directions of polarization are different. The difference df between the resonance frequency and the antiresonance frequency of length mode is calculated, and then the polarization degree is determined. Because two types of polarization degrees having different vibration modes cannot be compared, DF of an area expansion vibration of the multi-layered piezoelectric body after the first polarization is converted into electro-mechanical-coupling-coefficient K, and set to a remaining polarization degree Pr1. The difference df of a length vibration of the multi-layered piezoelectric body after the secondary polarization is converted into electro-mechanical-coupling-coefficient K, and set to a remaining polarization degree Pr2. By comparing these remaining polarization degrees Pr1 and Pr2, the amount of the secondary polarization is determined.

Moreover, in the third preferred embodiment, the multilayered piezoelectric body in which the first polarization is performed includes a layer having a reversed polarization direction. Therefore, a length vibration is excited. Thus, both the remaining polarization degree Pr1 of a first polarization and the remaining polarization degree Pr2 of a secondary polarization can be calculated from the value which is attained by converting the difference df between the resonance frequency and antiresonance frequency of a length vibration into electro-mechanical-coupling-coefficient K.

Figure 9:
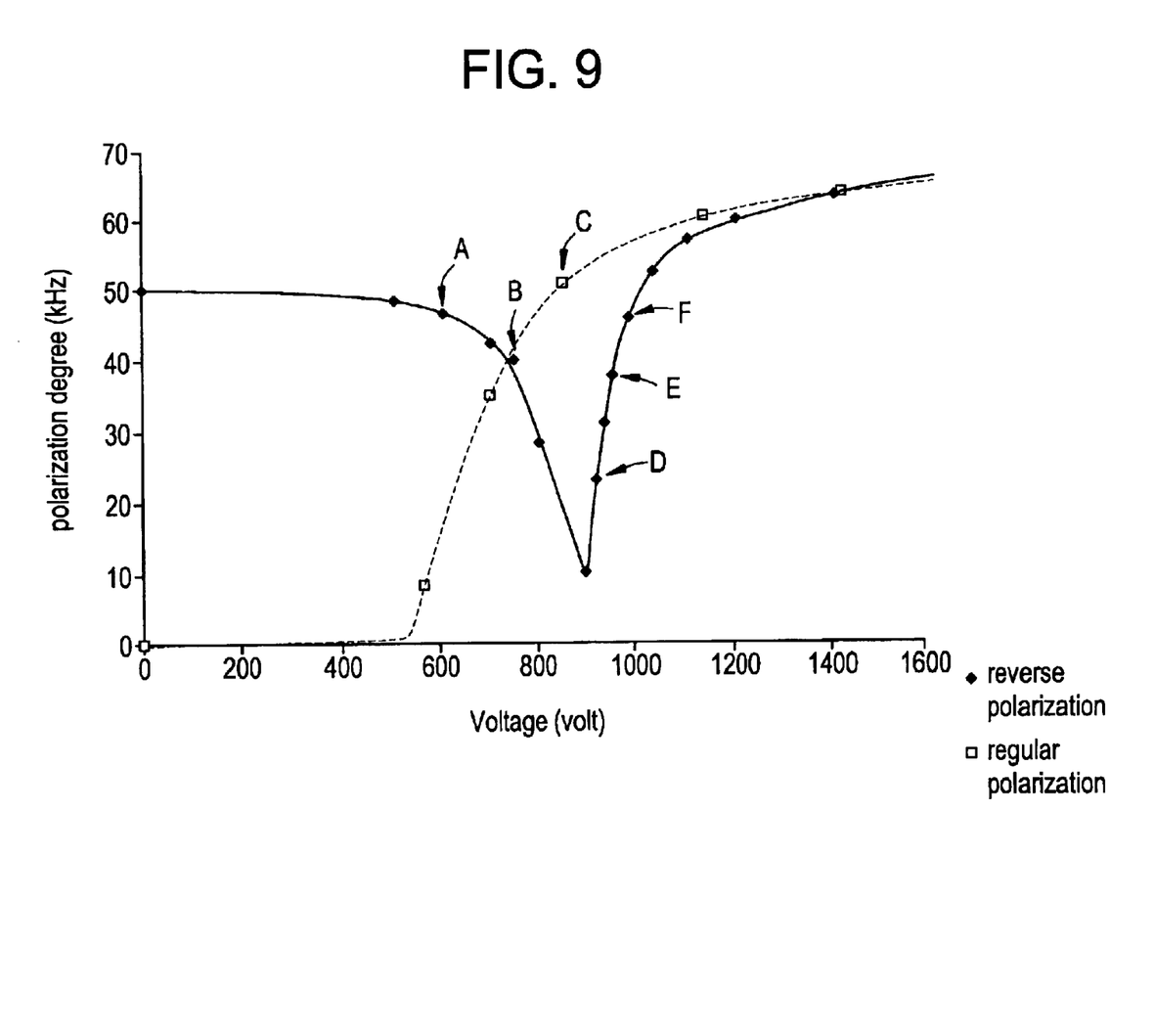
FIG. 9 is a diagram showing variations in the polarization degree of the reversed polarization layer when changing the applied voltage of a secondary polarization.
Figure 10A:
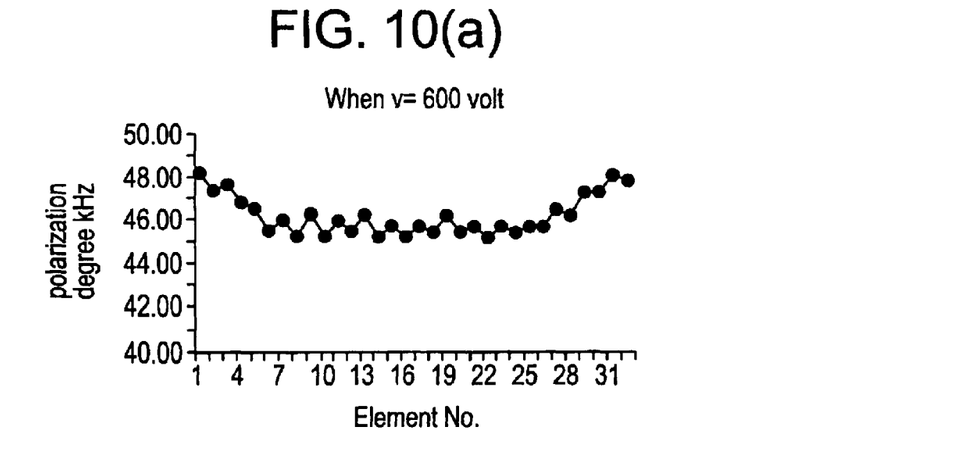
FIG. 10 is a diagram showing the polarization degree distribution in each point of A–F of FIG. 9.
Figure 10B:
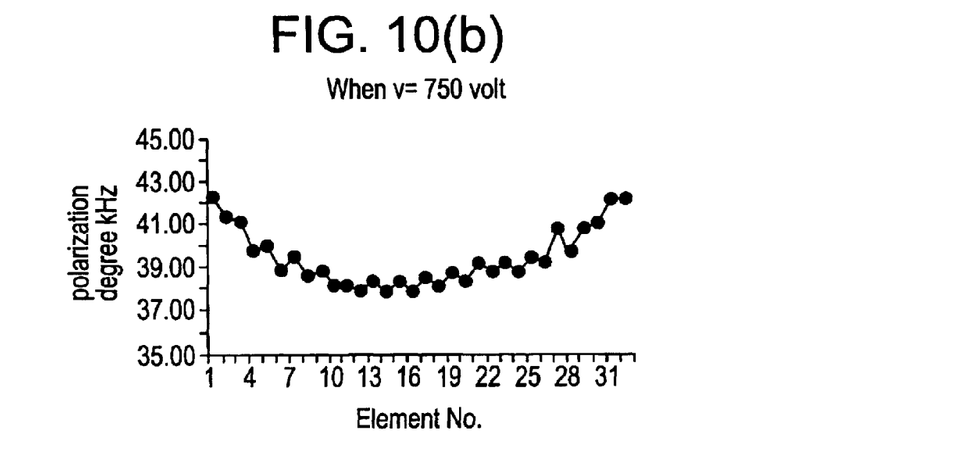
Figure 10C:
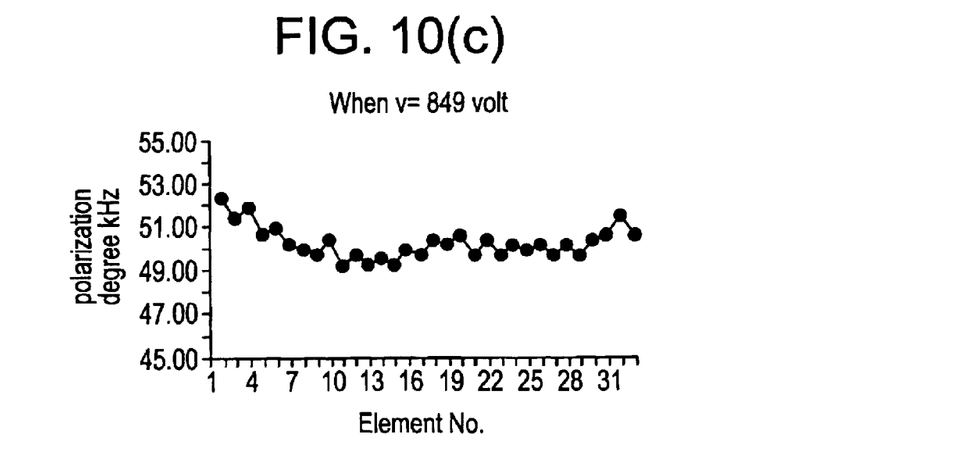
Figure 10D:
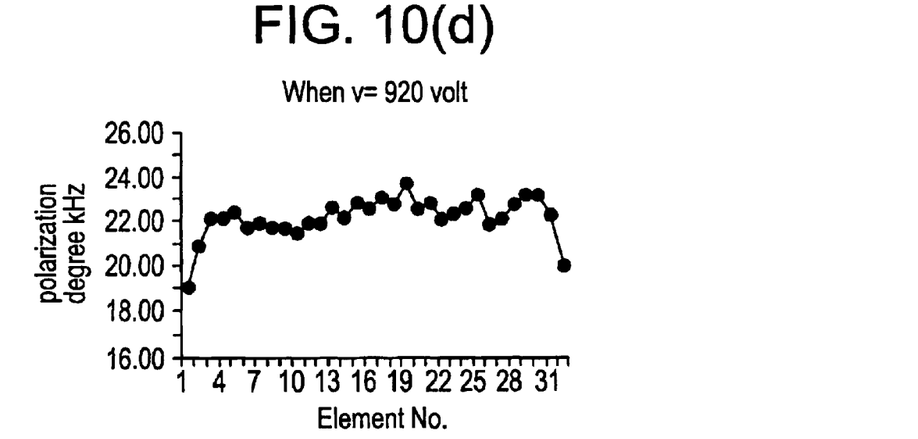
Figure 10E:
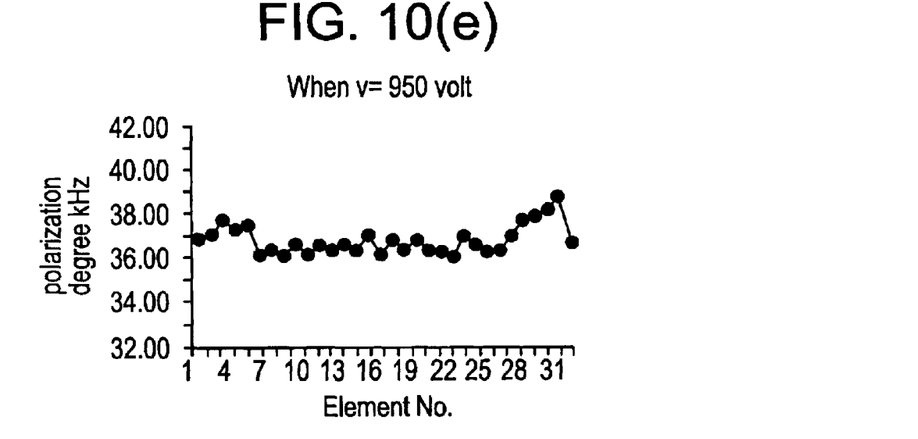
Figure 10F:
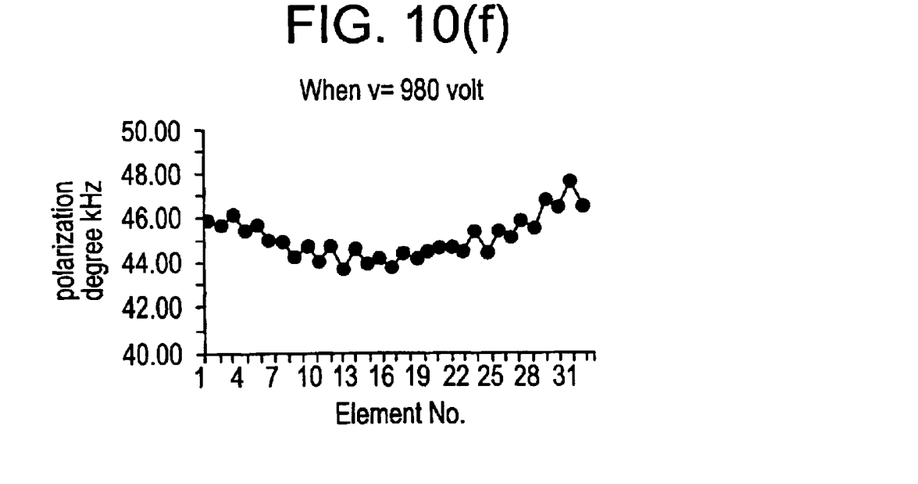

FIG. 9 shows variations in the polarization degree Pr2 of a substantially rectangular layer having a direction of polarization that is reversed when the voltage applied in the second polarization is changed. The remaining polarization degree Pr1 is approximately equal to 50 kHz in the first polarization for a desired PZT type piezoelectric ceramics. FIG. 10 shows the polarization degree distribution in each point A to F of FIG. 9. In addition, the change in the degree of polarization of the piezoelectric layer (a regular polarization layer) when changing an applied voltage is also illustrated in FIG. 9. The thickness of a piezoelectric layer is preferably about 0.56 mm.

Clearly from FIGS. 9 and 10, in the layer in which the polarization is reversed, depolarization is performed in accordance with a voltage increase in a secondary polarization. A direction of polarization is reversed when the voltage is about 900 v, and a polarization degree increases after that. If the voltage of a secondary polarization increases to about 1000 v, after polarization reversal, the remanent polarization degree Pr2 of a polarization inversion layer will be set to be about 50 kHz, and will become approximately equal to the remanent polarization degree of Pr1 of a first polarization. Until the voltage of the secondary polarization increases to near 900 v to 1000 v (referring to points D and E), the polarization degree distribution is approximately flat or slightly convex-shaped. When the voltage increases to more than about 1000 v (referring to point F), the polarization degree distribution becomes concave.

Therefore, the voltage of the secondary polarization is set such that Pr1≧Pr2, in other words, the voltage is set to be in the range of about 900 v to about 1000 v.

In addition, the polarization degree is approximately 0 in a regular polarization layer until the voltage exceeds about 500 v. However, the polarization degree increases at voltages greater than about 500 v. During that period, the polarization degree distribution within a rectangle is concave and it does not vary substantially.

In FIGS. 9 and 10, although the piezoelectric layer in which the repolarization is performed is not illustrated, in the case of a repolarization layer, the electric field of the secondary polarization does not vary until the electric field in the secondary polarization exceeds the polarization degree in the first polarization. When the electric field in the secondary polarization exceeds the polarization degree of the first polarization, the polarization degree in the secondary polarization becomes greater than the polarization degree of the first polarization for the first time. During that period, the polarization degree distribution within a rectangle is still concave in the regular polarization layer and does not vary substantially.

Various aspects of preferred embodiments and comparative examples of the polarization method of the multilayered piezoelectric body according to the present invention are explained below. In this example, a PZT type multi-layered piezoelectric body was used as a material of a length mode piezoelectric resonator (df=55 kHz).

FIRST EXAMPLE

Figure 11A:
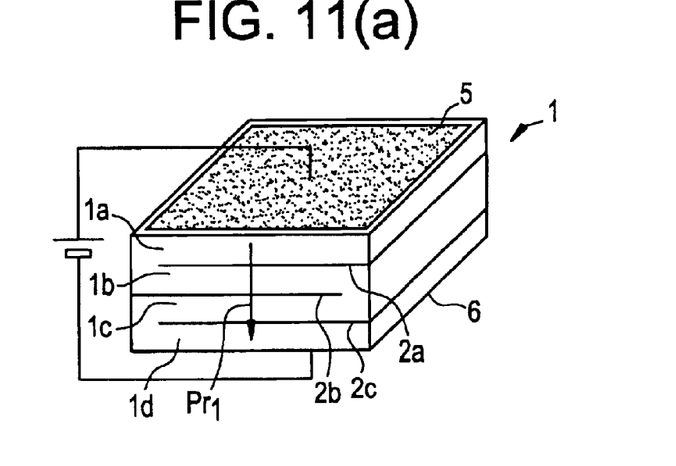
FIGS. 11(a) to 11(c) are process drawings showing an example of the polarization method in accordance with the first example of preferred embodiments of the present invention.
Figure 11B:
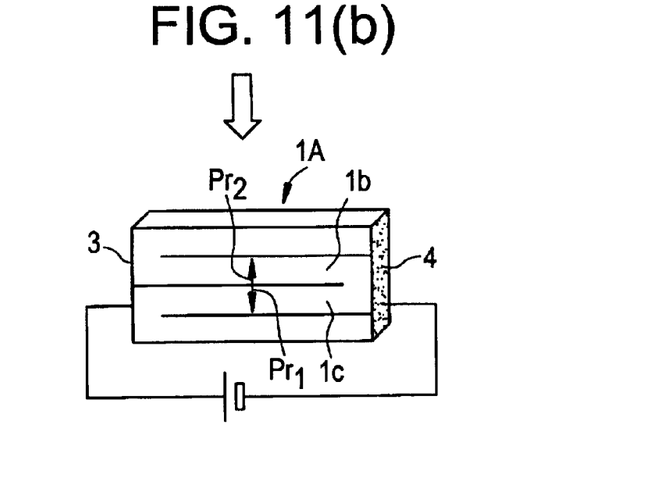
Figure 11C:
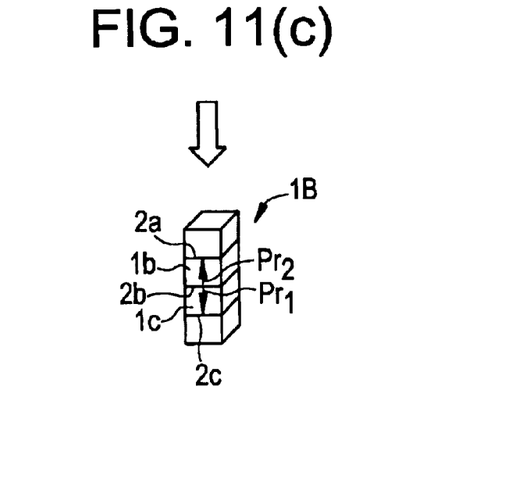

FIG. 11 shows a manufacturing process of the length mode piezoelectric resonator according to a first example of preferred embodiments of the present invention.

First, an electro-conductive paste for internal electrodes that includes silver, palladium, an organic binder, or other suitable materials, is applied on one side of a green sheet that includes a piezoelectric ceramics, and these sheets are alternately laminated. The laminated structure is integrally baked at about 1200 degree C., and the multi-layered piezoelectric body 1 having a block shape with approximate dimensions of 20 mm×30 mm×3.9 mm is formed. Front and back electrodes 5 and 6 are provided on front and back surfaces of this block 1, and a DC electric field is applied between the front and back electrodes 5 and 6, and the first polarization is performed (referring to (a) of FIG. 11).

The conditions of the first polarization are as follows: electric field is about 1.5 kv/mm, polarization time is about 10 min, and retention-temperature is about 70 degrees C. After that, an aging process is performed at about 150 degrees Celsius for about 1 hour.

Next, side electrodes 3 and 4 leading out an internal electrode are alternately provided on a side surface of the block-like multi-layered piezoelectric body 1 after the first polarization. Then, this multi-layered piezoelectric body 1 was cut in a vertical direction to produce one substantially rectangular element using a dicer. To the rectangle 1A, a DC electric field was applied to the side surface electrodes 3 and 4, and the secondary polarization was performed (referring to (b) of FIG. 11). At this time, the polarization degree of each rectangle 1A was set to a desired value by controlling the polarization time. The conditions of the secondary polarization are set as follows: electric-field is 1.5 kv/mm, polarization temperature is 70 degrees C.

The polarization time is controlled to adjust the desired polarization degree (a polarization degree of the rectangle responded to the polarization degree of a length mode element, df=55 kHz). After that, the aging process was performed at about 250 degree Celsius for about 1 hour.

The range of the secondary polarization is determined to be as described in the following. The range, wherein the value in which the difference df between the resonance frequency and the antiresonance frequency of the length vibration mode of the rectangle 1A after the secondary polarization is converted into an electro-mechanical-coupling-coefficient K (remanent polarization degree Pr2), does not exceed the value of the difference DF between the resonance frequency and the antiresonance frequency of the area expansion oscillation mode of the block 1 after the first polarization is converted into an electro-mechanical-coupling-coefficient K (remanent polarization degree Pr1), that is, Pr1≧Pr2.

Every other electrode of the rectangle 1A exposed at the side surface was coated with an insulating material after the secondary polarization, and a silver electrode was provided thereon. This was cut by the dicer and a 1.5 mm*1.5 mm *3.8 mm length mode piezoelectric resonator 1B was obtained (referring to (c) of FIG. 11).

Since the specific structure of this piezoelectric resonator 1B is the same as that of FIG. 1, the explanation thereof is omitted.

Comparative Example

A block-like multi-layered piezoelectric body is formed by a similar method as the first example. Side surface electrodes for alternately leading out an internal electrode are provided on the side surface of the body. A DC electric field was applied to the side surface electrode of the multi-layered piezoelectric body, and the polarization was performed (referring to FIG. 2).

Polarization conditions are as follows: electric-field is 1.5 kv/mm, and retention-temperature is 70 degree C. A polarization time is controlled to achieve a desired polarization degree DF=2.0+/−0.2 kHz. Polarization degree DF was calculated from the difference between the resonance frequency and the antiresonance frequency of the area expansion oscillation mode of a block.

After that, the aging process was performed at about 250 degree C. for about 1 hour, the piezoelectric block is cut into a desired size, and a length mode piezoelectric resonator was obtained.

The frequency characteristics of the impedance of the two elements which obtained by the above method are measured, and the value df=55 kHz was measured as the difference between a resonance frequency and an antiresonance frequency.

Table 1 and Table 2 show the comparison in the polarization degree df and in the resonant frequency fr between the first example and Comparative Example in a property classification process, wherein σn−1 is a standard deviation and r is the difference between the maximum value and the minimum value.

TABLE 1

First Example

|  | Evaluation Lot 1 | Evaluation Lot 2 | Evaluation Lot 3 | Average Value |
|---|---|---|---|---|
| df |  |  |  |  |
| Average | 56.15 | 55.82 | 55.03 | 55.67 |
| σ$_{n-1}$ | 0.90 | 0.92 | 0.90 | 0.91 |
| max. | 58.5 | 58.5 | 58.5 | 58.50 |
| min. | 54 | 53.5 | 52.5 | 53.33 |
| r | 4.5 | 5 | 6 | 5.17 |
| fr |  |  |  |  |
| Average | 450.8 | 449.72 | 449.86 | 450.13 |
| σ$_{n-1}$ | 0.90 | 1.03 | 1.10 | 1.01 |
| max. | 454.00 | 454.00 | 454.50 | 454.17 |
| min. | 448.00 | 447.00 | 447.00 | 447.33 |
| r | 6.00 | 7.00 | 7.50 | 6.83 |

TABLE 2

Comparative Example

|  | Evaluation Lot 1 | Evaluation Lot 2 | Evaluation Lot 3 | Evaluation Lot 4 | Evaluation Lot 5 | Average Value |
|---|---|---|---|---|---|---|
| df |  |  |  |  |  |  |
| Average | 56.44 | 56.22 | 56.41 | 56.69 | 56.31 | 56.41 |
| σ$_{n-1}$ | 2.19 | 1.97 | 2.09 | 2.01 | 1.97 | 12.04 |
| max. | 63.00 | 62.50 | 62.50 | 63.00 | 63.00 | 62.80 |

TABLE 2-continued

Comparative Example

|  | Evaluation Lot 1 | Evaluation Lot 2 | Evaluation Lot 3 | Evaluation Lot 4 | Evaluation Lot 5 | Average Value |
|---|---|---|---|---|---|---|
| min. | 52.50 | 51.50 | 52.50 | 53.00 | 53.00 | 52.80 |
| r | 10.50 | 11.00 | 10.00 | 10.00 | 10.00 | 10.30 |
| | | | fr | | | |
| Average | 448.99 | 448.69 | 448.63 | 448.96 | 447.88 | 448.63 |
| $\sigma_{n-1}$ | 1.37 | 1.41 | 1.19 | 1.29 | 1.15 | 1.28 |
| max. | 452.50 | 452.00 | 451.50 | 452.00 | 450.50 | 451.70 |
| min. | 444.50 | 443.50 | 444.50 | 445.00 | 444.50 | 444.40 |
| r | 8.00 | 8.50 | 7.00 | 7.00 | 6.00 | 7.30 |

Tables 1 and 2 show that the average value of the standard deviation σn−1 of df, is 2.04 kHz in the first example and 0.91 kHz in the Comparative Example. The first example has approximately half of the variation in a polarization degree df of the Comparative Example. Moreover, the average value of the standard deviation σn−1 of a resonance frequency fr is 1.28 kHz in the first example and 1.01 kHz in the Comparative Example. Thus, the variation in the resonance frequency fr has been reduced by about 30%.

SECOND EXAMPLE

FIG. 12 shows a manufacturing process of a length mode piezoelectric resonator according to a second example of preferred embodiments of the present invention.

In this example, a plurality of operations of the first polarization are performed in the state of a block 1 (referring to (a) and (b) of FIG. 12) and the direction of polarization was reversed through the entire block 1.

Figure 12A:
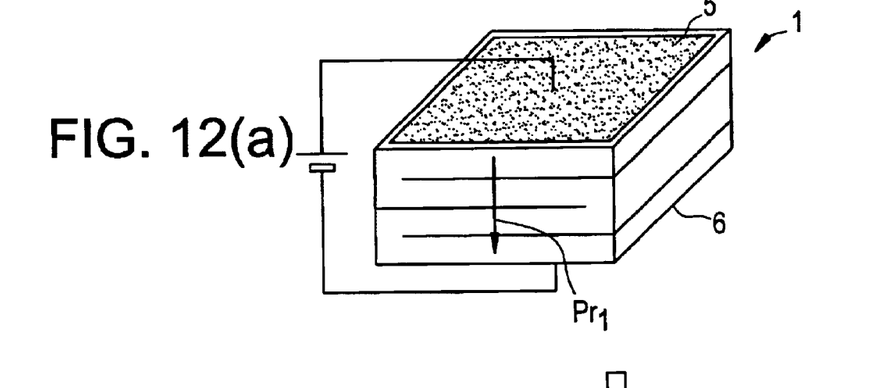
FIGS. 12(a) to 12(d) are process drawings showing an example of the polarization method in accordance with the second example of preferred embodiments of the present invention.
Figure 12B:
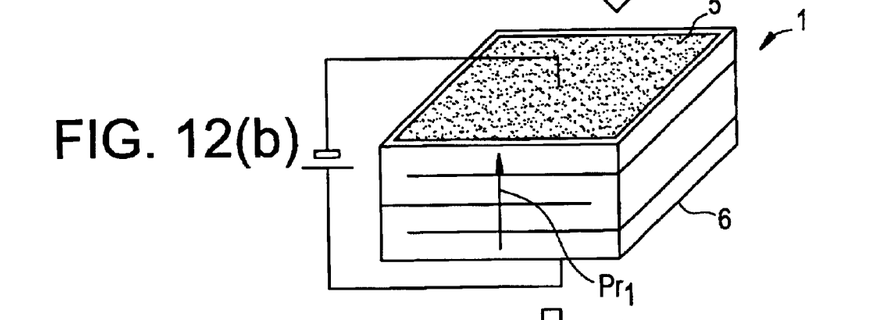
Figure 12C:
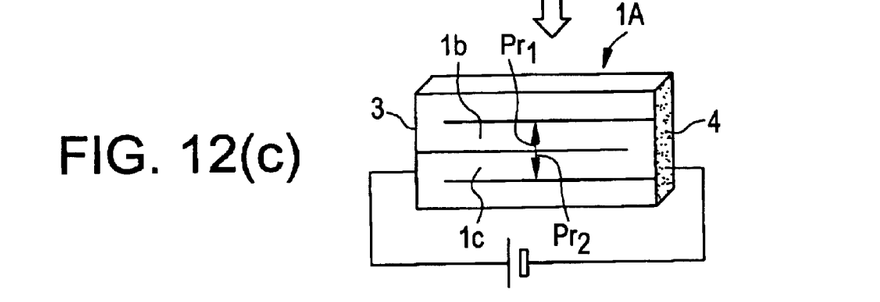
Figure 12D:
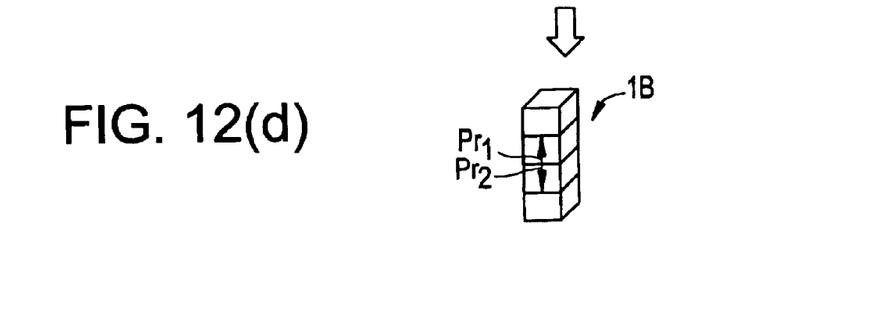

In this case, the difference ΔP2 between a center section and an edge portion decreases as the polarization is reversed as shown in FIG. 4. Therefore, when the block is cut into a rectangle 1A in (c), the polarization degree variation (concave distribution) between rectangles 1A and within a rectangle 1A decreases. Therefore, when a secondary polarization is performed in (c), a concave polarization degree distribution of the piezoelectric layer 1c is equalized.

In addition, the process of (b) is not restricted to a single process, but may be performed a plurality of times.

Table 3 shows the lot variation in the polarization degree df and the resonance frequency fr of the second example.

As shown in Table 3, the average value of the standard deviation σn−1 of a polarization degree df is 0.85 kHz and the average value of the standard deviation σn−1 of a resonance frequency fr is 0.96 kHz. Thus, the second example further reduces the variation.

TABLE 3

Second Example

|  | Evaluation Lot 1 | Evaluation Lot 2 | Evaluation Lot 3 | Average Value |
|---|---|---|---|---|
| | | df | | |
| Average | 53.93 | 53.44 | 54.03 | 53.80 |
| $\sigma_{n-1}$ | 0.96 | 0.71 | 0.87 | 0.85 |
| max. | 58.00 | 55.00 | 57.50 | 56.83 |
| min. | 50.00 | 51.50 | 52.00 | 51.17 |
| r | 8.00 | 3.50 | 5.50 | 5.67 |

TABLE 3-continued

Second Example

|  | Evaluation Lot 1 | Evaluation Lot 2 | Evaluation Lot 3 | Average Value |
|---|---|---|---|---|
| | | fr | | |
| Average | 449.15 | 448.93 | 449.06 | 449.05 |
| $\sigma_{n-1}$ | 0.85 | 0.97 | 1.06 | 0.96 |
| max. | 451.50 | 452.00 | 451.50 | 454.17 |
| min. | 446.00 | 446.00 | 446.50 | 446.17 |
| r | 5.50 | 6.00 | 5.00 | 5.50 |

THIRD EXAMPLE

Figure 13A:
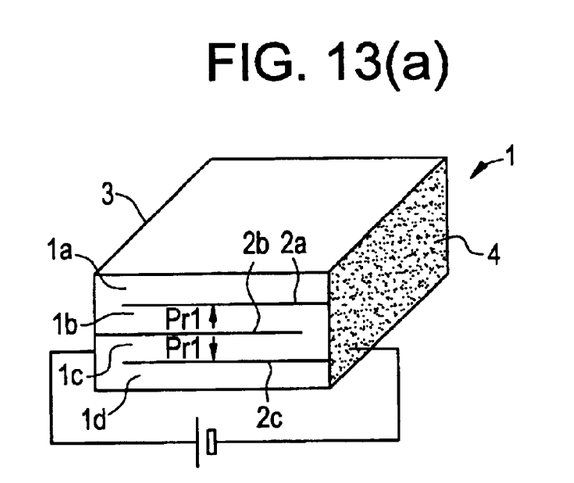
FIGS. 13(a) to 13(c) are process drawings showing an example of the polarization method in accordance with the third example of preferred embodiments of the present invention.
Figure 13B:
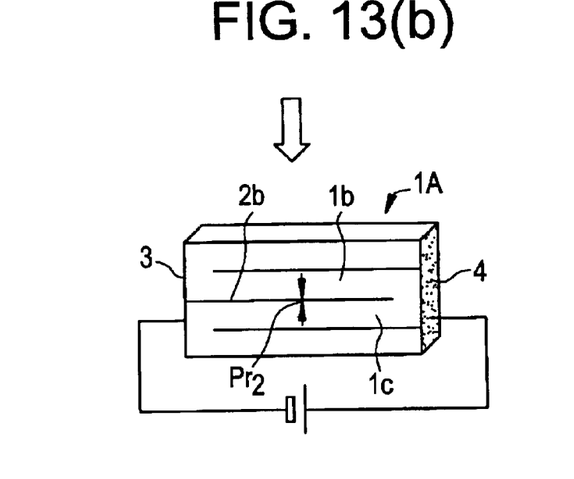
Figure 13C:
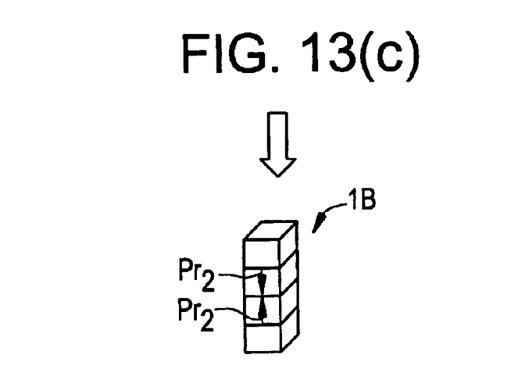

FIG. 13 shows a manufacturing process of a length mode piezoelectric resonator according to a third example of preferred embodiments of the present invention.

The electro-conductive paste for internal electrodes that includes silver, palladium, an organic binder, or other suitable material, is applied on one side of a green sheet including a piezoelectric ceramic. These are alternately laminated and are integrally baked at about 1200 degree C., and then the multi-layered piezoelectric body 1 having approximate dimensions of 20 mm×30 mm×3.9 mm in a block form was produced. In addition, the side surface electrodes 3 and 4 for leading out an internal electrode are alternately provided on a side surface of the multi-layered piezoelectric body 1. A DC electric field was applied between the side surface electrodes 3 and 4 and a first polarization was performed (referring to (a) of FIG. 13).

The conditions of the first polarization are as follows: electric-field is 1.5 kv/mm, polarization time is 10 min., and retention-temperature is about 70 degree C. After that, an aging process was performed at about 150 degree C. for 1 hour.

Next, the block-like multi-layered piezoelectric body 1 was cut in a vertical direction using a dicer to produce a substantially rectangular shape. The DC electric field is applied to the cut rectangle 1A via the side surface electrodes 3 and 4, and a secondary polarization was performed (referring to (b) of FIG. 13). At this time, the direction of the voltage application to the rectangle 1A was in the reversed direction to that of the first polarization. The degree of polarization of each rectangle 1A was uniformly set to a desired value by the control of the polarization time.

The conditions of the secondary polarization are set as follows: electric-field is 1.5 kv/mm, and polarization temperature is about 70 degree C. A polarization time is controlled to achieve the desired polarization degree (polarization degree of the rectangle responded in polarization degree df=55 kHz of a length mode element). After that, the aging process was performed at about 250 degree C. for about 1 hour.

The range of the secondary polarization is determined as follows: A range in which a remanent polarization degree Pr2 wherein the difference df between the resonance frequency and the antiresonance frequency of the length oscillation mode of the rectangle after a secondary polarization is converted into electro-mechanical-coupling-coefficient K does not exceed a remanent polarization degree Pr1 wherein the difference DF between the resonance frequency and the antiresonant frequency of the length oscillation mode of the block after the first polarization is converted into electro-mechanical-coupling-coefficient K, that is, Pr1≧Pr2.

Every other electrode exposed at a side surface of the rectangle 1A is coated with an insulating material after the secondary polarization, and a silver electrode was provided thereon. The dicer cuts this, and a 1.5 mm×1.5 mm ×3.8 mm length mode piezoelectric resonator 1B was obtained. The structure of this piezoelectric resonator 1B is the same as that of the piezoelectric resonator of the first example.

The frequency characteristic of the impedance in piezoelectric resonator of the third example and in the piezoelectric resonator of Comparative Example is measured. df=55 kHz value was obtained as a difference between a resonance frequency and an antiresonance frequency.

Table 4 shows lot variations of the polarization degree df and the resonance frequency fr in the third example.

As shown in Table 4, the average value of the standard deviation $\sigma_{n-1}$ of a polarization degree df is 1.03 kHz and the average value of the standard deviation $\sigma_{n-1}$ of a resonance frequency fr is 0.92 kHz. The variation in a polarization degree df is substantially greater that in the first example. However, the variation in a resonance frequency fr is the smallest of the three examples.

TABLE 4

| | Third Example | | | |
|---|---|---|---|---|
| | Evaluation Lot 1 | Evaluation Lot 2 | Evaluation Lot 3 | Average Value |
| | df | | | |
| Average | 54.72 | 54.91 | 55.91 | 55.18 |
| $\sigma_{n-1}$ | 0.96 | 0.99 | 1.14 | 1.03 |
| max. | 56.53 | 55.82 | 58.15 | 56.83 |
| min. | 51.61 | 50.44 | 52.50 | 51.52 |
| r | 4.91 | 5.38 | 5.65 | 5.31 |
| | fr | | | |
| Average | 450.62 | 449.56 | 452.26 | 450.81 |
| $\sigma_{n-1}$ | 0.71 | 0.93 | 1.12 | 0.92 |
| max. | 451.90 | 450.98 | 454.00 | 452.29 |
| min. | 447.93 | 446.20 | 448.68 | 447.60 |
| r | 3.97 | 4.78 | 5.32 | 4.69 |

The polarization method of this invention is not limited to the above-described examples of preferred embodiments.

For instance, the secondary polarization was performed only once to the piezoelectric body 1A of a rectangular shape in FIGS. 11 to 13. However, the secondary polarization may be repeated several times. In other words, the direction of an electric field may be reversed and reversal of a direction of polarization may be repeated several times.

Moreover, when the mass-production property and a polarization degree distribution are considered, a first polarization is performed to a block-like multi-layered piezoelectric body and a secondary polarization is performed to the multi-layered piezoelectric body having a substantially rectangular shape. However, a first polarization and a secondary polarization may be performed on a block-like multi-layered piezoelectric body, and a first polarization and a secondary polarization may be performed to the multi-layered piezoelectric body having a substantially rectangular shape.

In addition, in the first and second examples (FIGS. 5, 6, 11 and 12), after a secondary polarization, the remaining polarization degree of the piezoelectric layer having a direction of polarization that is reversed was temporarily set to Pr2 and was explained. This is intended to simplify the understanding of these examples. In actuality, the entire (the piezoelectric layer in which the repolarization layer and the direction of polarization are reversed is included) rectangle after a secondary polarization is excited by the length oscillation mode and the remanent polarization degree thereof is set to Pr2.

As described above, according to a preferred embodiment of the present invention, after performing the first polarization which uniformly polarizes the multi-layered piezoelectric body in the thickness direction, when the secondary polarization which reverses the direction of polarization of only the piezoelectric layer of one side of an internal electrode is performed, because the secondary polarization is performed in a range in which the remanent polarization degree Pr2 after the secondary polarization in the piezoelectric layer having a direction of polarization that is reversed does not exceed the remaining polarization degree Pr1 after the first polarization, the polarization degree distribution of the piezoelectric layer having a direction of polarization that is reversed is convex-shaped or flat. Therefore, since the polarization degree distribution of the piezoelectric layer having a direction of polarization that is reversed is convex-shaped or flat, and a polarization degree distribution of the piezoelectric layer having a direction of polarization that is not reversed is concave, an approximately uniform polarization degree distribution is obtained for the overall multi-layered piezoelectric body. As a result, when cutting and using a multi-layered piezoelectric body, that usable portion greatly increases, and thus the yield greatly improves.

According to another preferred embodiment of the present invention, after performing the first polarization which polarizes the piezoelectric layers on both sides of the internal electrode in opposite directions, when the secondary polarization which reverses the direction of polarization of the piezoelectric layers on both sides of the internal electrode is performed, because a secondary polarization is performed in a range in which the remanent polarization degree Pr2 after the secondary polarization in the piezoelectric layer having a polarization axis that is reversed does not exceed the remaining polarization degree of Pr1 after the first polarization, the polarization of the piezoelectric layers on both sides of the internal electrode in which the polarization is reversed. The polarization degree distribution is substantially equalized. Also, because the polarization degree of the adjacent piezoelectric layers is approximately equal, outstanding resonance characteristics are achieved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A polarization method of a multi-layered piezoelectric body in which a plurality of piezoelectric layers and a plurality of internal electrodes are alternately laminated and adjacent piezoelectric layers are polarized in the thickness direction thereof such that the polarization directions thereof are in opposite directions; comprising steps of:

a first polarization process in which an electric field in a first thickness direction is applied to the multi-layered piezoelectric body and the polarization is uniformly performed in the first thickness direction, a secondary polarization process in which an electric field in a second thickness direction that is opposite to the first thickness direction is applied to the piezoelectric layers of both sides of the internal electrodes and the direction of polarization of the piezoelectric layer on only one side of the internal electrode is reversed;

wherein the secondary polarization process is performed in a range such that a remaining polarization degree Pr2 that exists after the secondary polarization process in the piezoelectric layer having a direction of polarization that is reversed does not exceed a remaining polarization degree Pr1 after the first polarization.

2. A polarization method of a multi-layered piezoelectric body according to claim 1, wherein the above first polarization process comprises:

a first process in which an electric field in the first thickness direction is applied to the multi-layered piezoelectric body, and a second process in which an electric field in the second thickness is applied to the multi-layered piezoelectric body, and wherein the direction of polarization of the multi-layered piezoelectric body produced by the first process is uniformly reversed by the second process.

3. A polarization method of the multi-layered piezoelectric body according to claim 1, wherein the first polarization is performed on a block-like multi-layered piezoelectric body and the secondary polarization process is performed on a substantially rectangular-shaped multi-layered piezoelectric body produced by cutting the block-like multi-layered piezoelectric body in a vertical direction substantially parallel to the internal electrodes.

4. A polarization method of the multi-layered piezoelectric body according to claim 1, wherein the electric fields applied to the multi-layered piezoelectric body are DC electric fields.

5. A polarization method of the multi-layered piezoelectric body according to claim 1, wherein the polarization degree distribution produced by the first polarization process has a concave shape, and the polarization degree distribution produced by the second polarization process has a flat or convex shape, such that the overall polarization degree distribution of the multi-layered piezoelectric body is uniform.

6. A polarization method of the multi-layered piezoelectric body according to claim 1, wherein the remaining polarization degree Pr2 and the remaining polarization degree Pr1 are approximately equal.

7. A polarization method of the multi-layered piezoelectric body according to claim 1, wherein the remaining polarization degree Pr2 is about 50 kHz.

8. A polarization method of the multi-layered piezoelectric body according to claim 6, wherein the remaining polarization degree Pr1 and the remaining polarization degree Pr2 are about 50 kHz.

9. A polarization method of the multi-layered piezoelectric body according to claim 1, wherein the voltage of the electric field applied in the second polarization process is in the range of about 900 v to about 1000 v.

10. A polarization method of the multi-layered piezoelectric body according to claim 1, wherein the multi-layered piezoelectric body is made of PZT-type piezoelectric ceramic.

11. A polarization method of a multi-layered piezoelectric body in which a plurality of piezoelectric layers and a plurality of internal electrodes are alternately laminated and a polarization is performed on adjacent piezoelectric layers in the thickness direction such that the polarization directions thereof are in opposite directions, comprising;

a first polarization process in which electric fields in opposite directions are applied to the piezoelectric layers on both sides of the internal electrodes such that the piezoelectric layers on both sides of internal electrodes are polarized in opposite directions, and a secondary polarization process in which electric fields in the opposite directions to the electric fields in the first polarization process are applied to the piezoelectric layers of both sides of the internal electrode such that the polarization axes of the piezoelectric layers of both sides of the internal electrode are reversed, wherein the secondary polarization process is performed in a range such that a remaining polarization degree Pr2 that exists after the secondary polarization in the piezoelectric layers having a direction of polarization that is reversed does not exceed the remaining polarization degree Pr1 that exists after the first polarization.

12. A polarization method of the multi-layered piezoelectric body according to claim 11, wherein the first polarization is performed on a block-like multi-layered piezoelectric body and the secondary polarization process is performed on a substantially rectangular-shaped multi-layered piezoelectric body produced by cutting the block-like multi-layered piezoelectric body in a vertical direction substantially parallel to the internal electrodes.

13. A polarization method of the multi-layered piezoelectric body according to claim 11, wherein the electric fields applied to the multi-layered piezoelectric body are DC electric fields.

14. A polarization method of the multi-layered piezoelectric body according to claim 11, wherein the polarization degree distribution produced by the first polarization process has a concave shape, and the polarization degree distribution produced by the second polarization process has a flat or convex shape, such that the overall polarization degree distribution of the multi-layered piezoelectric body is uniform.

15. A polarization method of the multi-layered piezoelectric body according to claim 11, wherein the remaining polarization degree Pr2 and the remaining polarization degree Pr1 are approximately equal.

16. A polarization method of the multi-layered piezoelectric body according to claim 11, wherein the remaining polarization degree Pr2 is about 50 kHz.

17. A polarization method of the multi-layered piezoelectric body according to claim 15, wherein the remaining polarization degree Pr1 and the remaining polarization degree Pr2 are about 50 kHz.

18. A polarization method of the multi-layered piezoelectric body according to claim 11, wherein the voltage of the electric field applied in the second polarization process is in the range of about 900 v to about 1000 v.

19. A polarization method of the multi-layered piezoelectric body according to claim 11, wherein the multi-layered piezoelectric body is made of PZT-type piezoelectric ceramic.

* * * * *